(12) United States Patent
Burgess

(10) Patent No.: US 7,466,173 B2
(45) Date of Patent: *Dec. 16, 2008

(54) RADIO TRANSCEIVER HAVING A PHASE-LOCKED LOOP CIRCUIT

(75) Inventor: Paul Burgess, Bochum (DE)

(73) Assignee: Nokia Corporation, Espoo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 11/405,875

(22) Filed: Apr. 17, 2006

(65) Prior Publication Data

US 2006/0181318 A1    Aug. 17, 2006

Related U.S. Application Data

(63) Continuation of application No. 10/433,745, filed as application No. PCT/EP01/13238 on Nov. 15, 2001, now Pat. No. 7,061,288.

(30) Foreign Application Priority Data

Dec. 7, 2000    (EP)    ................................ 00126868

(51) Int. Cl.
*H03L 7/06* (2006.01)
(52) U.S. Cl. ........................................ 327/148; 327/157
(58) Field of Classification Search ................ 327/147, 327/148, 150, 155, 157, 159, 162, 163; 331/17, 331/25, DIG. 2, 1 A, 2; 375/373–376
See application file for complete search history.

(56) References Cited

U.S. PATENT DOCUMENTS

| 4,510,461 | A | * | 4/1985 | Dickes et al. | ................ | 331/1 A |
|---|---|---|---|---|---|---|
| 5,389,898 | A | * | 2/1995 | Taketoshi et al. | ............... | 331/2 |
| 5,648,744 | A | | 7/1997 | Prakash et al. | ................. | 331/11 |
| 5,686,864 | A | | 11/1997 | Martin et al. | ................ | 331/1 A |
| 5,740,213 | A | | 4/1998 | Dreyer | ........................ | 375/374 |
| 5,870,003 | A | | 2/1999 | Boerstler | ...................... | 331/17 |
| 5,909,149 | A | | 6/1999 | Bath et al. | ....................... | 331/2 |
| 5,923,196 | A | | 7/1999 | Okamoto | ..................... | 327/156 |
| 6,133,769 | A | | 10/2000 | Fontana et al. | .............. | 327/156 |
| 6,133,797 | A | | 10/2000 | Lovelace et al. | ............... | 331/17 |
| 6,600,797 | B1 | * | 7/2003 | Hasegawa et al. | ............ | 375/376 |
| 6,670,833 | B2 | | 12/2003 | Kurd et al. | ................... | 327/156 |
| 6,839,394 | B1 | * | 1/2005 | Duffy | .......................... | 375/376 |

FOREIGN PATENT DOCUMENTS

JP        07147537 A    *    6/1995

* cited by examiner

*Primary Examiner*—Kenneth B. Wells
*Assistant Examiner*—Ryan C Jager
(74) *Attorney, Agent, or Firm*—Alfred A. Fressola; Ware, Fressola, Van Der Sluys & Adolphson LLP

(57) ABSTRACT

The invention relates to a phase-locked loop circuit (1) in a radio transceiver for the detection of the linear operation of a first voltage controlled oscillator (2), which comprises a frequency divider (8), a reference oscillator (10), a phase detector (12) to compare the phases of the reference oscillator (10) with a divided frequency of the frequency divider (8), and a charge pumping means (14) connected to the phase detector (12) and is characterized in that the connection (13) between the phase detector (12) and the charge pumping means (14) has at least one branch-off line (15) connected to at least one filtering means (22), whose output voltage is related to the linear operation of the voltage controlled oscillator (2).

55 Claims, 2 Drawing Sheets

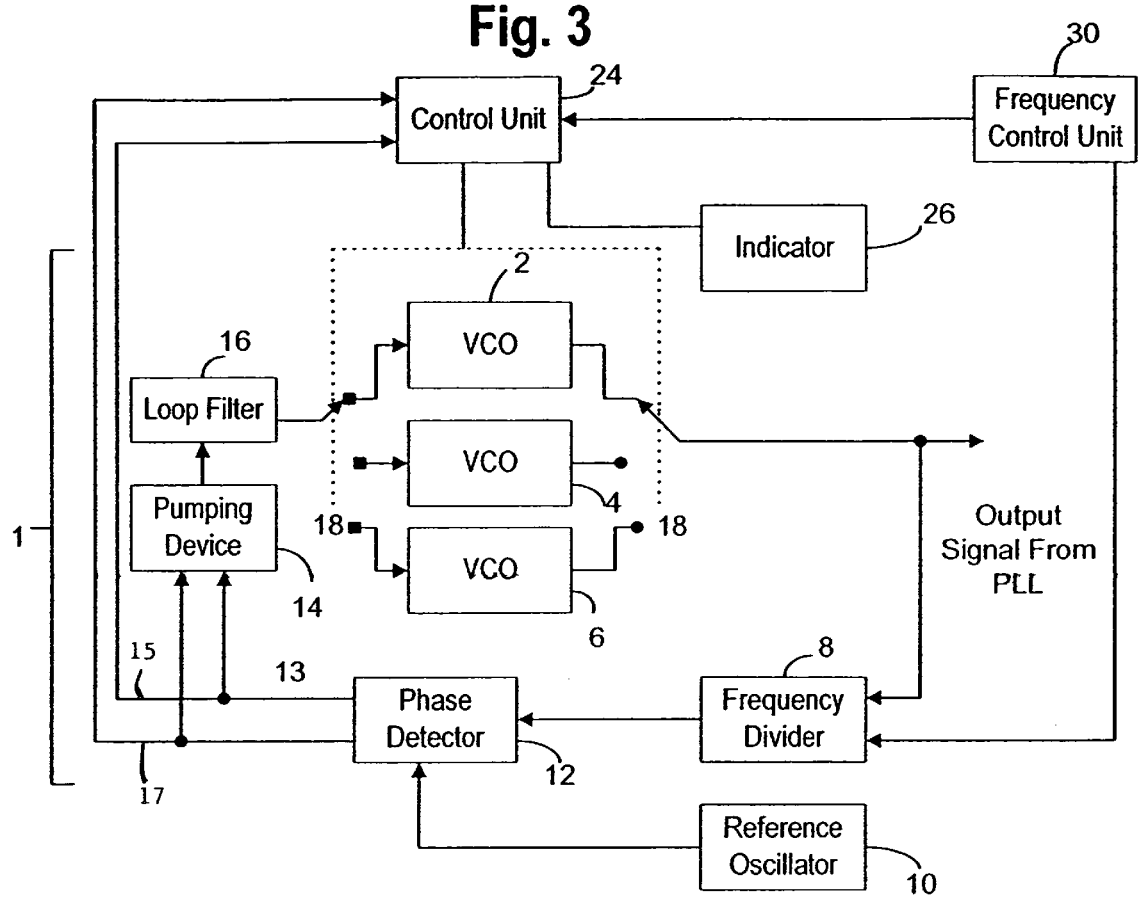
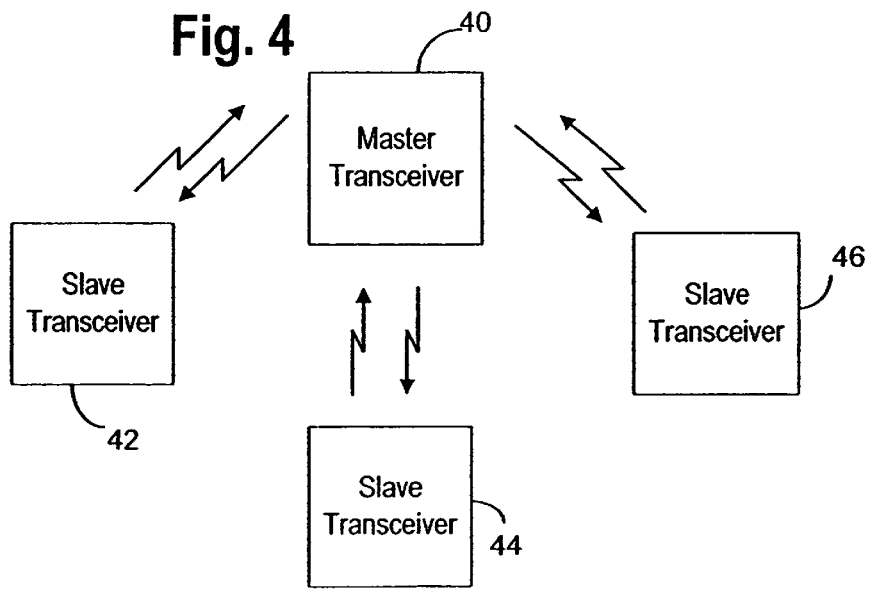

RADIO TRANSCEIVER HAVING A PHASE-LOCKED LOOP CIRCUIT

CROSS REFERENCE TO RELATED APPLICATION

This application is a continuation of U.S. patent application Ser. No. 10/433,745 filed on Nov. 4, 2003 now U.S. Pat. No. 7,061,288, which application was filed as an entry into the U.S. national phase under §371 for International Application No. PCT/EP01/13238 having an international filing date of Nov. 15, 2001, and which in turn claims priority to European Patent Application 00126868.9, filed on Dec. 7, 2000.

TECHNICAL FIELD

The present invention relates generally to radio transceivers using a voltage controlled oscillator (VCO) in a phase-locked loop circuit (PLL). It also relates generally to radio transceivers optimised to achieve a wide range frequency coverage using the ability to select among a number of VCOs in order to find the best suited VCO to generate a predetermined channel frequency. In particular the present invention relates to a phase locked loop circuit for the detection of the linear operation of the VCO and a method for its operation.

BACKGROUND OF THE INVENTION

The growing spread of cellular phones in recent years shows the demand for low cost transceivers. As for the phones, a wireless transmission system is planned to replace connection wires in other technical fields.

One conventional system to replace connection wires is the Bluetooth™ system. This is a low power, short range, and low cost radio communication system that is planned to replace wires or cables between computers, components, e.g. monitors and the like. The Bluetooth™ system operates at a frequency of 2.4 GHz. The frequency band is called ISM (Industrial Scientific and Medicine) and is destined for unlicensed low power radio operation up to a maximum irradiated power of 100 mW, or 20 dbm. With an irradiated power up to 100 mW a spatial transmission range of a few centimeters up to a few hundred meters can be attained. Due to limitations in different countries, a varying number of 23 to 79 channels having a bandwidth of 1 MHz are allocated for the unlicensed use. The Bluetooth™ system uses a frequency hopping algorithm to reduce interference caused by other users of the ISM band. The frequency hopping is executed at a rate of 1600 hops per second.

With such a short distance radio transmission all connection problems associated with e.g. laptop computers having periphery devices such as printers, storage means, or a network are easily solved, thereby obviating the need for a wire connection.

In most transceivers having variable frequency a PLL is used to generate the channel frequency. The use of a PLL is a well known and cheap way to build a variable frequency generator having almost the frequency stability of a quartz oscillator.

A standard PLL comprises at least one VCO, a frequency divider, a reference oscillator, a phase detector and a charge pump. In the standard operation, the VCO is oscillating at a frequency determined by the DC voltage provided by the charge pump, wherein the output oscillation from the VCO is divided by a frequency divider and the phases are compared with the phases of a reference oscillator in a phase detector, its output voltage determining the action of the charge pump, wherein the charge pump is controlling the DC voltage for determining an oscillation frequency of the VCO.

The output frequency of the PLL is determined by the division factor of the frequency divider and the frequency of the reference oscillator.

The PLL has one major restriction, in that its frequency range is limited by the resonance frequency range of the VCO. When using a Bluetooth™ module in countries with a frequency range of the ISM band limited to 23 channels, it is sufficient to use one VCO whose frequency range covers the 23 channels. The receiving and transmitting frequencies of the VCO are tuned in accordance with the frequency hopping algorithm.

It is important to know whether the VCO is operating linearly, to prevent energy from being wasted and the settling time frame being increased. So it is helpful to have an indicator to detect whether the PLL is in a linear operation state. It is state of the art to measure the DC input voltage of the VCO and check the output signal for its linearity to determine a relation between the input voltage and the linearity of the operation of the PLL. This includes that the input voltage of the VCO is slightly changed when it is measured.

In a PLL comprising a plurality of VCOs with overlapping frequency ranges, the PLL is designed such that one VCO is used in the not overlapping regions of the frequency range. For frequencies in the region of the overlap of two VCOs the PLL can alternatively be operated with one of both VCOs. In the overlapping region of the frequency ranges the problem resides in determining which of both VCOs should be used to generate a given frequency. It is therefore necessary to determine a boundary of the frequency range for each VCO. The VCO frequency range and its centre frequency (average) can depend on product tolerances. The boundary frequency must therefore be determined separately for each device.

The control voltage of the VCO can be used to determine if a VCO other than the operating VCO should be switched into the PLL to reach maximum linearity of the PLL output signal.

The main disadvantage of this known technique is the fact that the frequency range of each VCO has to be measured, the switching points have to be determined, and all these data have to be stored in a special storing means in the transceiver. The VCOs may in addition change their frequency ranges due to temperature shift and ageing effects.

SUMMARY OF THE INVENTION

One object underlying the invention is to find a method and an apparatus to detect whether a VCO in a PLL is operating linearly, preferably without using any large scale alignment or any storage means.

A further object of the present invention is to increase the capacity of the manufacturing process by simplifying the alignment process leading to shorter cycle times, and to simplify the construction of a wide frequency range PLL.

This is achieved according to one aspect of the invention, by a phase locked loop circuit in which a branch off line from the connection between the phase detector and the charge pumping means is provided. The branch off line allows measurement of the pulse width of the signals from the phase detector output without feed back to the PLL.

According to a preferred aspect of the invention, the PLL comprises two VCOs and a selective switching means to cover a wider frequency range. A transceiver can use the pulse width of the signal from the branch off line to optimise the PLL operation by tracking the boundary frequency. When using a Bluetooth™ module with a frequency hopping algorithm in a wide frequency range transceiver the frequency hop rate is 1600 hops per second. With every frequency hop to another frequency within the frequency range of the currently used VCO, the tuning of the currently used VCO has to be changed. With every frequency hop to a frequency out of the frequency range of the currently used VCO, the VCO has to be changed, and the other VCO has to be tuned. With a frequency hop rate of 1600 hops per second and a permuting use of 79 channels, this procedure leads to a VCO-change rate between 40 and 1600 VCO changes per second.

According to yet another preferred aspect of the invention, the PLL comprises a plurality of at least three VCOs. The frequency ranges of the VCOs should be neighbouring or adjacent and overlapping for an even coverage of a wide frequency range. The signal from the branch off line can be used to automatically post-align the boundary frequencies.

In a preferred embodiment of the invention the charge pumping device includes a charge source and/or a charge sink. Such can be used to optimise the transient response of the PLL. That also includes that the connection between the phase detector and the charge pumping means is a multi wire line, and therefore the branch off line is a multi wire line, too.

Preferably the branch off line can include a logical unit as a driver or an inverter. If a multi-wire branch off line is used the logical units can include AND-, Not-AND-, Not-OR-, or exclusive-Not-OR-gates.

Preferably the logical unit comprises exclusive-OR- or OR-gates.

These logic units allow on one hand the generation of a single signal out of a multi-wire line. In combination with suitable filters almost any signal in accordance with the linearity of the operation of the VCO can be generated. So even a specific phase detector failure signal can be created, if the branch off line is connected to an exclusive-Not-OR gate.

In a preferred embodiment the PLL includes a rectifier, so that, when a high pass filter is used, the rectifier can rectify an AC voltage signal into a DC voltage signal, if necessary.

Preferably, the PLL comprises at least one time delay unit. The time delay unit can be used to generate a DC signal, at the end of an OR-gate, if the inputs are connected in parallel, with one input including a time delay unit looped in. The delay time is expected to be variable between zero and 1 period of oscillation of the reference oscillator. If the output signal of the OR-gate is high-pass filtered and rectified, the output voltage shows a step-like transition behaviour pattern.

According to another preferred aspect of the invention, the signals from the branch off line are fed into a control unit, relating the signals to the switch position of a selective switching means, to automatically select a linear operating VCO. If the PLL comprises only two VCOs it may be sufficient to use the signal to control a bistable switching means. With a PLL comprising a plurality of VCOs, the signals from the branch off line can be used to determine the best suited VCO the control unit is going to switch to. In this case the PLL can comprise a multistable step-controlled switching means.

Preferably, the control unit comprises a hysteresis characteristic, to prevent the unit from continuously switching from one VCO to another. This is preferably ensured by an adequate overlap of the frequency ranges of the VCOs.

Preferably the control unit comprises a time delay unit, to prevent the unit from continuously switching from one VCO to another. This is preferably assured by an adequate overlap of the frequency ranges of the VCOs, or a hysteresis characteristic in the control unit. It prevents the control unit from continuously switching from one VCO to another even if the overlap of adjoining frequency ranges is too small, due to operation conditions or production tolerances.

According to another preferred aspect of the invention a transmitter, a receiver or a transceiver using a PLL according to the invention are easier to use, less susceptible to interference and less power consuming, especially in mobile electrical appliances.

According to yet another preferred aspect of the invention a network using transceivers having a PLL according to the invention, permits linear operation of each VCO of the PLLs used in the network.

In a preferred embodiment of the invention the operation period of the phase detector is detected and low pass filtered at the end of the branch off line from the connection between the phase detector and the charge pumping device, and subsequently the DC output voltage of the low pass filter is measured, to decide whether the VCO is operating linearly. This is a method to detect a signal if the oscillation lacks linearity.

In another preferred embodiment of the invention the operation period of the phase detector is detected and high pass filtered at the end of the branch off line from the connection between the phase detector and the charge pumping device, and subsequently the DC output voltage of the low pass filter is measured, to decide if the VCO is operating linearly. This is a standard use to detect a signal if the VCO is oscillating linearly.

Preferably the signals from the branch-off line to the filtering device are logic- or time-processed. With this processing, measurement of noise signals can be avoided. The use of logic gates allows use of only one low-pass filter even if two ore more charge pumping means are used.

In another preferred embodiment of the invention, the output signal of the filtering means is used to cause a switching means to switch in another VCO into the PLL circuit. With this measure a PLL of a transceiver will always be in a linear operation state. Thereby a self adjusting linearly operating transceiver can be provided.

In the case that more than two VCOs are used, it is preferable to generate a direction signal for or in the control unit, to determine the VCO to be switched to. Thereby it is avoided that the control unit keeps switching between the first and the second VCO, instead of switching to the third VCO having a best fitting frequency range.

In another preferred embodiment of the invention, the linearity of the operation state is detected and used to generate an optical or acoustical signal to inform a user or a technician about the present operation state. This includes to display information related to the linearity of the operating VCO, or relating to which VCO is presently looped in the circuit.

According to the present invention, a wide frequency range transceiver is provided using a phase locked loop circuit (PLL) that can automatically switch between a multitude of voltage controlled oscillators (VCO) and presents a number of advantages to the manufacturer as well as for the user or a maintenance technician. The manufacturer can save nearly the whole alignment process during the assembly, as well as means for storage of the switch point of the selective switching means. The user benefits from the fact that the PLL of the transceiver according to the invention is always in a linear operation state, irrespective of external conditions as temperature or other frequency range shifting effects. The user of the transceiver may ignore any variable resistor positions inside the transceiver. A maintenance technician benefits from the fact, that in the invention there are no variable resistors susceptible to dust and humidity, no storage means whose data may get lost, and no difficulty to measure analog signals in order to find a failure or defect on the circuit board.

During normal linear operation of the PLL the charge sink and the charge source of the charge pumping device will be turned on with only very short pulses. When the VCO is operated outside of its linear range, one of the charge sink and the charge source will remain turned off while the other will remain turned on for a long period. An Exclusive OR logic will therefore produce a long pulse which is filtered by the low pass filter to produce a logic high signal to indicate the linear range of the VCO has been exceeded.

The pulse width is related to the control DC voltage of the VCO. This DC voltage of the VCO is related to the linearity of the operation of the VCO. Thus, instead of measuring the analog DC voltage between charge pump and VCO, it is envisaged to monitor the digital pulse width between the phase detector and the charge pump. With the digital pulse width signal filtered, a signal can be generated, that is related to the linear operation of the PLL. This can be especially an "out of range-" or an "in range-" signal.

A transceiver using a PLL according to the invention is cheaper and easier to manufacture, easier to use and easier to maintain.

BRIEF DESCRIPTION OF THE DRAWINGS

Further advantages, advantageous embodiments and additional applications of the invention are provided in the following description of a preferred embodiment of the invention in connection with the enclosed figures.

FIG. 3 is a block diagram of a PLL having three VCOs according to the invention.

FIG. 4 is a block diagram of a radio transceiver network having a PLL according to the invention.

DETAILED DESCRIPTION

While the following description is in the context of wireless communication systems involving portable or mobile radio telephones and/or computer communication systems, it will be understood by those skilled in the art that that the present invention may be applied to other oscillating devices. Moreover, the present invention may be used in any non radio frequency emitting device as a variable oscillator such as computers etc.

Figure 1:
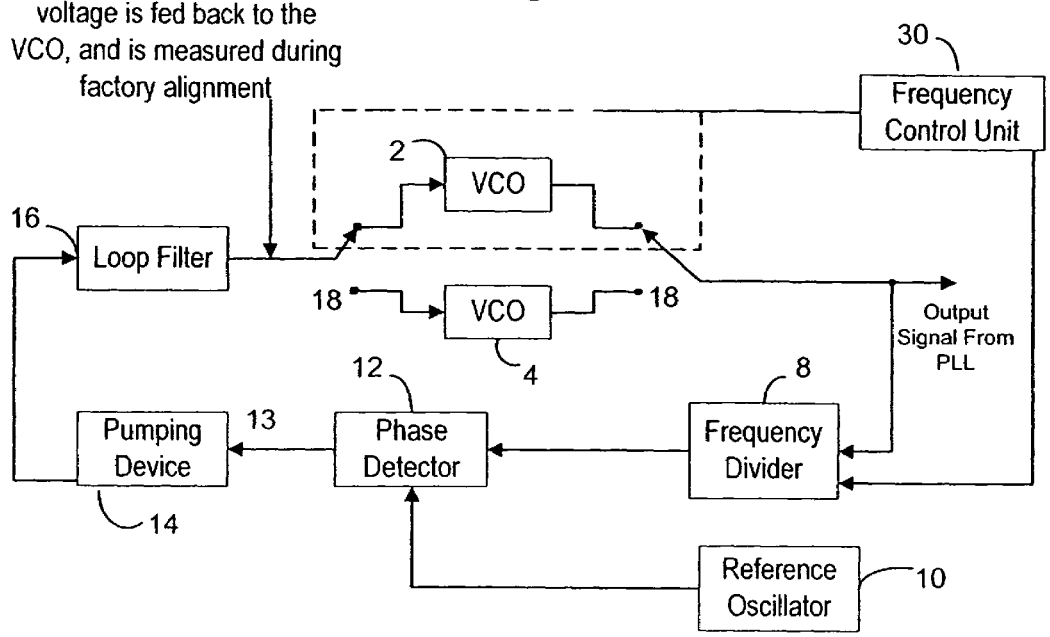
FIG. 1 is a block diagram of a conventional two VCO PLL.

FIG. 1 describes a conventional solution of a two VCO PLL factory alignment. A conventional wide frequency range two VCO PLL comprises two VCOs 2,4, to generate a variable frequency related to an input DC voltage. It also comprises a frequency divider 8 to divide the frequency of said VCO, a reference oscillator 10 and a phase detector 12 to compare the phases of the divided frequency and of the reference oscillator. The phase detector connected to the pumping means 14, generates a DC voltage signal related to the divergence of the divided frequency from the reference frequency. This signal is fed back to the VCO via a loop filter 16. The signal locks the VCO frequency to a multiple of the frequency of the reference oscillator 10.

The loop filter 16 filters all high frequency AC voltages to prevent the feedback from getting resonant and unstable. The output frequency of the PLL is determined by the division factor of the frequency divider 8 and the frequency of the reference oscillator 10. The PLL output frequency is determined by a frequency control unit 30 determining the division factor of the frequency divider 8 and the switch position of the selective switching means 18. The factory alignment process determines the switching point in the frequency control unit 30. The function of the factory alignment is to measure the VCO control voltage when the VCO is generating a known frequency. The block diagram in FIG. 1 shows one example of an embodiment system using two VCOs that can be aligned by measuring the VCO control voltage during production. The algorithm which is followed during factory alignment of the PLL is as follows:

Set switches 18 to "up" position as shown to connect the first VCO 2

Lock PLL to start with frequency close to the end of the frequency range of the transceiver Measure VCO 2 control voltage Increase lock frequency until control voltage exceeds a given voltage range Flip switches 18 to "down" position to connect the second VCO 4

Lock PLL to start operation until frequency is close to the other end of the frequency range of the transceiver Measure VCO 4 control voltage Reduce lock frequency until control voltage exceeds a given range Decide frequency boundary at which use of VCO will be changed, and lay down the switching point of the frequency control unit.

The number of steps and the fact that an analog DC voltage in a short distance to a RF source has to be measured, shows the difficulty that can be expected. Another disadvantage is that the whole frequency range of the transceiver has to be scanned. And even that does not prove linear operation of the selected oscillator at any condition. Another serious drawback is the fact that the frequency ranges of the VCOs may drift due to temperature and ageing effects. This conventional PLL system is not capable of compensating such frequency drift effects.

Figure 2:
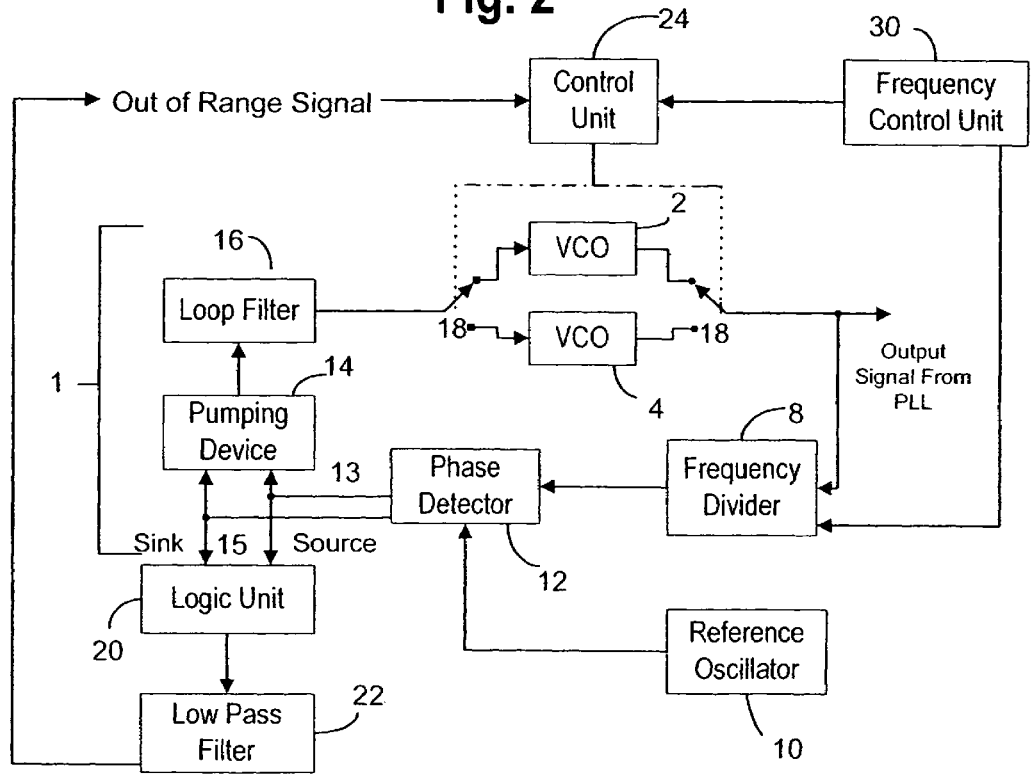
FIG. 2 is a block diagram of a PLL having two VCO according to the invention.

FIG. 2 displays a block diagram of a PLL according to one embodiment of the invention. As in conventional two VCO PLLs, the PLL according to the invention comprises two VCOs 2, 4, to generate a variable frequency related to an input DC voltage. It also comprises a frequency divider 8, to divide the frequency, a reference oscillator 10 and a phase detector 12 to compare the phases of the divided frequency and the reference oscillator. The phase detector being connected to a charge pumping means 14 generates a DC voltage signal related to the deviation of the divided frequency from the reference frequency. This signal is fed back to the VCO via a loop filter 16. The signal locks the VCO frequency to a multiple of the frequency of the reference oscillator 10. The loop filter 16 filters all high frequency AC voltages to prevent the feedback from getting resonant and unstable. The output frequency of the PLL is determined by the division factor of the frequency divider 8 and the frequency of the reference oscillator 10. The frequency is determined by a frequency control unit 30 determining the division factor of the frequency divider 8 and the switch position of the selective switching means 18.

The PLL according to the invention further comprises a branch off line 15 from the connection 13 between the phase detector 12 and the charge pumping means 14. The end of the branch off line 15 is connected to a logic unit 20. The logic unit 20 is in this case an exclusive-OR-gate for receiving the signals for the charge sink and source. If the phase detector generates signals with long pulse width, the output variable of the exclusive-OR-gate has a corresponding pulse width. The output signal of the logic unit 20 is filtered by a low pass filter 22, wherein the pulse width is transformed into a DC voltage, related to the linearity of the operation state of the VCO. This DC voltage can be used as an input variable of a control unit 24 relating the switch position of said selective switching means to the DC voltage of the low pass filter 22. So the linearity of the operation state of the VCO 2,4 is related to the pulse width of the phase detector signals which is related to the pulse width of the logic unit signals. This in turn is related to the DC voltage of the low pass filter 22 which is related by the control unit 24 to the switch position of said selective switching means 18. Thereby it is assured that in case the VCO is no longer operating linearly, the previously active VCO 2 is replaced by the previously inactive VCO 4.

With this second feedback loop relating the linearity of an operation state of a VCO to its operation state, it is ensured that there is no alignment process necessary, since the PLL can decide by itself whether or when the active VCO is to be changed.

The same PLL can also be used to support the setting of a boundary frequency as follows:
 Set switches 18 to "up" position as shown to connect the first VCO 2
 Lock PLL to start operation with frequency close to the end of the frequency range of the transceiver
 Increase lock frequency until the DC voltage from the low-pass filter reaches a certain level
 Flip switches 18 to "down" position to connect the second VCO 4
 Lock PLL to start frequency until close to the other end of the frequency range of the transceiver
 Reduce lock frequency until the DC voltage from the low-pass filter reaches a certain level
 Set boundary frequency between the both ends of the frequency range of the transceiver at which the operation states of the first and the second VCO will be changed between active and inactive.

This simple setting of a boundary frequency is much easier, because it only comprises 7 instead of 9 steps, and it only needs a voltmeter for measuring instead of a radio frequency test assembly.

This simple setting of the boundary frequency is sufficient for a factory alignment process for PLLs having VCOs whose frequency ranges and centre frequencies are temperature- and ageing-resistant. During the alignment process an extra 1/0-bit can be inserted together with every frequency in the frequency control unit 30 or the control unit 24 to relate the switch position of the switches 18 to the currently used frequency.

This enables the PLL, having an adequate frequency control unit 30 and an adequate control unit 24 to execute self-contained tests during field operation. Such self-contained tests can also be used to compensate temperature and ageing effects. The said extra 1/0-bits are newly distributed to the frequencies, to adapt the PLL to a shifted boundary frequency.

Such self-contained tests can also be used to detect a failure or fault in the VCO or PLL.

With the possibility of a self contained test, the control unit can check the boundary frequency in predetermined intervals.

It is possible to execute a self-contained test prior to each transmission or reception to determine the most linear operating VCO.

FIG. 3 displays a block diagram of a 3 VCO wide frequency range PLL according to the invention. It comprises the same elements as the PLL shown in FIG. 2, and additionally further comprises a third VCO 6, a second branch off line 17 from the connection 13 between the phase detector and the charge pumping means 14 and a display 26. The main difference is that the control unit 24 is able to distinguish whether the charge sink or the charge source of the charge pumping means 14 is active. This information allows the control unit 24 to change the switch position of the selective switching means 18 in a direction that joins the VCO whose frequency range includes the actual used frequency. The PLL also includes a display in which it is indicated which VCO is actually active, and/or if the control unit receives an out of range signal from the low pass filter. The block diagram in FIG. 3 shows that the logic unit 20 and the low pass filter 22 are fully integrated in the control unit 24.

FIG. 4 illustrates a radio network 38 of transceiver units having PLLs according to the invention, including a master transceiver 40 and slave transceivers 42, 44 and 46 communicating by transmitting and receiving radio packets. The master transceiver 40 initiates the connection of a slave to the network. The network operates in a time division duplex fashion. The transceiver units are synchronised to a common time frame determined by the master transceiver 40. To prevent interference the time division duplex transmission is combined with a frequency hopping algorithm. The transceiver units are synchronised to the frequency hopping algorithm by the master transceiver 40. The master transceiver 40 is capable of performing point-to-point or point-to-multi-point communication. The slave transceivers 42, 44, 46 are only capable of replying to an order from the master transceiver 40. In this network 38 the master transceiver 40 and the slave transceivers 42, 44, 46 are capable of executing a self-contained test to realign the boundary frequencies. In this network 38 the master transceiver 40 is capable of dispatching an order to the slave transceivers 42, 44, 46 to execute self-contained tests to realign their boundary frequencies. Such a network operates at a frequency of 2.4 GHz, uses a frequency hopping algorithm, a time slot based transfer protocol and therefore allows real time voice and data communications.

While particular embodiments of the present invention have been described and illustrated, it should be understood that the invention is limited only by the attached claims. Since modifications may be made by persons skilled in the art, the present application contemplates any and all modifications that fall within the spirit and scope of the invention disclosed and claimed herein.

The invention claimed is:
1. An apparatus comprising:
 a first voltage controlled oscillator configured to operate in at least a first frequency range;
 at least a second voltage controlled oscillator, configured to operate in at least a second frequency range;
 a reference oscillator;
 a phase detector having at least one output indicative of a comparison of a phase of said reference oscillator with a phase of a signal associated with an active voltage controlled oscillator, said active voltage controlled oscillator being one of said first and at least second voltage controlled oscillators;
 a charge pump operatively coupled to said phase detector;
 a circuit configured to provide at least one direct current output signal related to linearity of an operation state of said active voltage controlled oscillator, said circuit having an input operatively coupled with the operative coupling between said phase detector and said charge pump; and
 a switching arrangement operatively coupled with the at least one direct current output signal of the circuit and operatively coupled with an output of the charge pump and in selective cooperative engagement with an input and an output of one of said first and at least second voltage controlled oscillators, the switching arrangement configured to at least operatively couple one of said first and at least second voltage controlled oscillators that is not said active voltage controlled oscillator so as to be the next active voltage controlled oscillator if said at least one direct current output signal indicates that the operation state of the current active voltage controlled oscillator is not linear.

2. The apparatus according to claim 1, further comprising a control unit operatively coupled with said at least one direct current output signal of said circuit and operatively coupled with said switching arrangement, said control unit configured to at least change the switching arrangement cooperative engagement of said first and said at least second voltage controlled oscillator in accordance with said output signal of the circuit.

3. The apparatus according to claim 2, wherein said control circuit comprises a hysteresis characteristic.

4. The apparatus according to claim 2, wherein said control circuit comprises a time delay circuit.

5. A radio receiver comprising an apparatus as claimed in claim 2.

6. A radio transmitter comprising an apparatus as claimed in claim 2.

7. A radio transceiver comprising an apparatus as claimed in claim 2.

8. A radio network, comprising transceivers as claimed in claim 7.

9. The apparatus according to claim 1, further comprising an indicator configured to annunciate which one of said first and at least second voltage controlled oscillators is active.

10. The apparatus according to claim 1, further comprising an indicator configured to annunciate information relating to an operating state of the apparatus.

11. The apparatus according to claim 1, wherein the first frequency range and second frequency range of said first and second voltage controlled oscillators at least partially overlap.

12. The apparatus according to claim 11, further comprising a control unit operatively coupled with said at least one direct current output signal of said circuit and operatively coupled with said switching arrangement, said control unit configured to at least change the switching arrangement cooperative engagement of said first and said at least second voltage controlled oscillator in accordance with said output signal of the circuit, and at least a third voltage controlled oscillator in selective operative engagement with said switching arrangement, said third voltage controlled oscillator configured to operate in at least a third frequency range that at least partially overlaps with the first frequency range or second frequency range of said first and second voltage controlled oscillators.

13. The apparatus of claim 12, wherein said control unit provides at least two direct current output signals so that the switching arrangement couples the voltage controlled oscillator that overlaps the active voltage controlled oscillator at a current operating frequency of said active voltage controlled oscillator.

14. The apparatus according to claim 1, further comprising a frequency divider operatively coupled with said switching arrangement and the phase detector, configured to provide said signal associated with said active voltage controlled oscillator.

15. The apparatus of claim 1, wherein the circuit comprises a logic unit and a filter for providing said at least one direct current output signal.

16. The apparatus of claim 15, wherein said logic unit generates an output having a duty cycle indicative of linearity of the operating state of the active voltage controlled oscillator.

17. The apparatus of claim 15, wherein said filter is a low pass filter.

18. An apparatus comprising:
a first voltage controlled oscillator configured to operate in at least a first frequency range;
at least a second voltage controlled oscillator configured to operate in at least a second frequency range;
a switching arrangement having selectable positions configured to provide an input to and an output of the first voltage controlled oscillator or the at least second voltage controlled oscillator;
a reference oscillator;
a frequency divider operatively coupled with the output of the switching arrangement;
a phase detector operatively coupled with an output of the frequency divider and the reference oscillator, configured to provide a phase of an output of said reference oscillator relative to the signal of the frequency divider;
a charge pump operatively coupled with the input of the switching arrangement and the phase detector; and
a circuit operatively coupled with the operative coupling between said phase detector and said charge pump, the circuit configured to provide at least one direct current output signal related to linearity of an operation state of said first or at least said second voltage controlled oscillator currently connected to said switching arrangement, said at least one direct current output signal for switching said switching arrangement from the voltage controlled oscillator currently connected to the switching arrangement to another of said voltage controlled oscillators if said at least one direct current output signal indicates that the operation of the currently connected voltage controlled oscillator is not linear.

19. The apparatus according to claim 18, further comprising a control unit operatively coupled with said at least one direct current output signal of the circuit and operatively coupled with said switching arrangement, said control unit configured to at least change the selectable position of said switching arrangement in accordance with said output signal of the circuit.

20. A radio receiver comprising an apparatus as claimed in claim 19.

21. A radio transmitter comprising an apparatus as claimed in claim 19.

22. A radio transceiver comprising an apparatus as claimed in claim 19.

23. A radio network, comprising transceivers as claimed in claim 22.

24. The apparatus according to claim 19, wherein said control circuit has a hysteresis characteristic.

25. The apparatus according to claim 19, wherein said control circuit comprises a time delay circuit.

26. The apparatus according to claim 18, further comprising an indicator configured to annunciate which one of said first and at least second voltage controlled oscillators said switching arrangement is configured to provide said input and said output for.

27. The apparatus according to claim 18, further comprising an indicator configured to annunciate information relating to an operating state of the voltage controlled oscillator that said switching arrangement is configured to provide said input and said output for.

28. The apparatus according to claim 18, wherein the first frequency range and second frequency range of said first and second voltage controlled oscillators at least partially overlap.

29. The apparatus according to claim 28, further comprising at least a third voltage controlled oscillator in cooperative engagement with said switching arrangement, said third voltage controlled oscillator configured to operate in at least a third frequency range that at least partially overlaps with the first frequency range or second frequency range of said first and second voltage controlled oscillators.

30. The apparatus of claim 18, wherein the circuit comprises a logic unit and a filter for providing said at least one direct current output signal.

31. The apparatus of claim 30, wherein said logic unit generates an output having a duty cycle indicative of linearity of the operating state of the first voltage controlled oscillator or at least the second voltage controlled oscillator.

32. The apparatus of claim 30, wherein said filter is a low pass filter.

33. An apparatus, comprising:
a first voltage controlled oscillator disposed and arranged so that it is connected into a phase-locked loop circuit by a switching arrangement, configured to provide an output signal in response to an applied input voltage when switched into the phase-lock loop circuit;
a phase detector, responsive to a signal associated with said output signal and with a reference signal, configured to provide a signal indicative of the input voltage to be applied to the voltage controlled oscillator connected into the circuit; and
a circuit, responsive to the signal indicative of the input voltage to be applied to the voltage controlled oscillator connected into the circuit, configured to provide at least one direct current output signal related to linearity of an operation state of said voltage controlled oscillator and useable for indicating whether to switch to a voltage controlled oscillator other than the voltage controlled oscillator connected into the circuit if said at least one direct current output signal indicates that the operation state of said voltage controlled oscillator is not linear based on said at least one direct current output signal.

34. The apparatus of claim 33, further comprising said switching arrangement, said switching arrangement operatively coupled with said first voltage controlled oscillator and said other voltage controlled oscillator, responsive to said at least one direct current output signal and configured to switch said first voltage controlled oscillator or said other voltage controlled oscillator into said circuit.

35. The apparatus according to claim 34, further comprising a control unit operatively coupled with said at least one direct current output signal and operatively coupled with said switching arrangement, said control unit configured to control the switching arrangement in accordance with said at least one direct current output signal.

36. A radio receiver comprising an apparatus as claimed in claim 35.

37. A radio transmitter comprising an apparatus as claimed in claim 35.

38. A radio transceiver comprising an apparatus as claimed in claim 35.

39. A radio network, comprising transceivers as claimed in claim 38.

40. The apparatus according to claim 35, wherein said control circuit comprises a hysteresis characteristic.

41. The apparatus according to claim 35, wherein said control circuit comprises a time delay circuit.

42. The apparatus according to claim 34, further comprising a frequency divider operatively coupled with said switching arrangement and the phase detector, configured to provide said signal associated with the output signal of the voltage controlled oscillator connected into the circuit.

43. The apparatus according to claim 33, a further comprising an indicator configured to annunciate which voltage controlled oscillator is switched into the circuit.

44. The apparatus according to claim 33, further comprising an indicator configured to annunciate information relating to the operating state of the voltage controlled oscillator that is switched into the circuit.

45. The apparatus according to claim 33, wherein a frequency range of said first voltage controlled oscillator and said other voltage controlled oscillator at least partially overlap.

46. The apparatus according to claim 45, further comprising at least a third voltage controlled oscillator, said third voltage controlled oscillator configured to operate in at least a third frequency range that at least partially overlaps with the frequency range of said first voltage controlled oscillator or said other voltage controlled oscillator.

47. A method comprising:
providing a detector signal associated with a phase comparison of a reference oscillator output signal and a signal associated with an output signal of a voltage controlled oscillator output connected into a circuit;
providing at least one direct current output signal related to linearity of an operation state of the voltage controlled oscillator based on said detector signal; and
switching to another voltage controlled oscillator so that said other voltage controlled oscillator is connected into said circuit if said at least one direct current output signal indicates that the operation state of said voltage controlled oscillator is not linear.

48. The method according to claim 47, wherein said providing at least one direct current output signal indicative of an operating state of said voltage controlled oscillator comprises detecting a duty cycle of said detector signal.

49. The method according to claim 48, further comprising filtering the detected duty cycle of said detector signal.

50. The method according to claim 49, further comprising displaying an indication of linearity of an operating state of the voltage controlled oscillator switched into the circuit.

51. The method according to claim 47, further comprising displaying which voltage controlled oscillator is switched into said circuit.

52. The method of claim 47, wherein said providing of at least one direct current output signal comprises providing at least two direct current output signals and further wherein said switching to another voltage controlled oscillator further comprises switching to one of at least two other voltage controlled oscillators.

53. An apparatus comprising:
means for providing a detector signal associated with a phase comparison of a reference oscillator output signal and a signal associated with an output signal of a voltage controlled oscillator output connected into a circuit;
means for providing at least one direct current output signal related to linearity of an operation state of the voltage controlled oscillator based on said detector signal; and
means for switching to another voltage controlled oscillator so that said other voltage controlled oscillator is connected into said circuit if said at least one direct current output signal indicates that the operation state of said voltage controlled oscillator is not linear.

54. The apparatus according to claim 53, further comprising means for displaying an indication of linearity of the operating state of the voltage controlled oscillator switched into the circuit.

55. A method comprising:
setting a switching arrangement to connect to a first voltage controlled oscillator;
locking a phase locked loop associated with said first voltage controlled oscillator to start operation with a frequency close to an end of a frequency range of a transceiver associated with said phase locked loop;
increasing a lock frequency until a voltage from a low pass filter responsive to a signal indicative of an operating state of said first voltage controlled oscillator reaches a certain level;
setting the switching arrangement to connect to a second voltage controlled oscillator;
locking the phase locked loop to a start frequency close to another end of the frequency range of the transceiver;
reducing the lock frequency until a voltage from the low pass filter, responsive to a signal indicative of an operating state of said second voltage controlled oscillator reaches a certain level; and
setting a boundary frequency between both ends of the frequency range of the transceiver at which operation is changed from the first voltage controlled oscillator to the second voltage controlled oscillator.

* * * * *